United States Patent
Kim et al.

(10) Patent No.: US 9,355,733 B2
(45) Date of Patent: May 31, 2016

(54) MEMORY SENSING SYSTEM COMPRISING NONVOLATILE MEMORY DEVICE AND RELATED METHOD OF OPERATION

(71) Applicant: SAMSUNG ELECTRONICS CO., LTD., Suwon-Si, Gyeonggi-Do (KR)

(72) Inventors: Jong-Young Kim, Seoul (KR); Ki Tae Park, Seongnam-si (KR); Bo Geun Kim, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 223 days.

(21) Appl. No.: 14/062,088

(22) Filed: Oct. 24, 2013

(65) Prior Publication Data

US 2014/0043904 A1 Feb. 13, 2014

Related U.S. Application Data

(63) Continuation of application No. 13/073,029, filed on Mar. 28, 2011, now abandoned.

(30) Foreign Application Priority Data

May 11, 2010 (KR) .................. 10-2010-0044124

(51) Int. Cl.
 *G11C 16/26* (2006.01)
 *G11C 11/56* (2006.01)
(52) U.S. Cl.
 CPC ............ *G11C 16/26* (2013.01); *G11C 11/5628* (2013.01)

(58) Field of Classification Search
 CPC ............................ G11C 11/5628; G11C 16/26
 See application file for complete search history.

(56) References Cited

U.S. PATENT DOCUMENTS

| | | |
|---|---|---|
| 2008/0055990 A1 | 3/2008 | Ishikawa et al. |
| 2008/0151617 A1 | 6/2008 | Alrod et al. |
| 2008/0209111 A1 | 8/2008 | Kang |
| 2009/0231914 A1 | 9/2009 | Yu et al. |
| 2009/0234792 A1 | 9/2009 | Kim et al. |
| 2010/0223538 A1 | 9/2010 | Sakurada |
| 2012/0163085 A1* | 6/2012 | Alrod et al. ............. 365/185.18 |

FOREIGN PATENT DOCUMENTS

| | | |
|---|---|---|
| KR | 1020080079510 A | 9/2008 |
| KR | 1020090099264 A | 9/2009 |
| KR | 1020090101160 A | 9/2009 |

* cited by examiner

*Primary Examiner* — Khamdan Alrobaie
(74) *Attorney, Agent, or Firm* — Volentine & Whitt, PLLC (57) ABSTRACT

A memory system performs a first sensing operation to sense whether multi-level cells assume an on-cell state or an off-cell state in response to a first read voltage applied to a selected word line. It then supplies a pre-charge voltage to bit lines corresponding to multi-level cells that have been sensed as assuming the off-cell state in response to the first read voltage, and it performs a second sensing operation with the supplied pre-charge voltage to sense whether each of the multi-level cells that have been sensed as assuming the off-cell state assumes an on-cell state or an off-cell state in response to a second read voltage applied to the selected word line.

20 Claims, 14 Drawing Sheets

| | S | U | M | L | C |
|---|---|---|---|---|---|
| E | 1 → 0 | 1 | 1 | 1 | - |
| P1 | 1 → 0 | 1 | 1 | 1 | - |
| P2 | 1 → 0 | 1 | 1 | 1 | - |
| P3 | 1 → 0 | 1 | 1 | 1 | - |
| P4 | 1 → 0 | 1 | 1 | 1 | - |
| P5 | 1 → 0 | 1 | 1 | 1 | - |
| P6 | 1 → 0 | 1 | 1 | 1 | - |
| P7 | 1/0 → 0/1 | 1 | 1 | 1 | - |
| P7 | 0 → 1 | 1 | 1 | 1 | - |
| P7 | 0 → 1 | 1 | 1 | 1 | - |
| P7 | 0 → 1 | 1 | 1 | 1 | - |
| P8 | 0 → 1 | 1 | 1 | 1 | - |
| P8 | 0 → 1 | 1 | 1 | 1 | - |
| P8 | 0 → 1 | 1 | 1 | 1 | - |
| P8 | 0 → 1 | 1 | 1 | 1 | - |
| P9 | 0 → 1 | 1 | 1 | 1 | - |
| P10 | 0 → 1 | 1 | 1 | 1 | - |
| P11 | 0 → 1 | 1 | 1 | 1 | - |
| P12 | 0 → 1 | 1 | 1 | 1 | - |
| P13 | 0 → 1 | 1 | 1 | 1 | - |
| P14 | 0 → 1 | 1 | 1 | 1 | - |
| P15 | 0 → 1 | 1 | 1 | 1 | - |

Inverse Dump

FIG. 4B

|     | S   | U   | M | L | C |
|-----|-----|-----|---|---|---|
| E   | 0   | 1   | 1 | 1 | – |
| P1  | 0   | 1   | 1 | 1 | – |
| P2  | 0   | 1   | 1 | 1 | – |
| P3  | 0   | 1   | 1 | 1 | – |
| P4  | 0   | 1   | 1 | 1 | – |
| P5  | 0   | 1   | 1 | 1 | – |
| P6  | 0   | 1   | 1 | 1 | – |
| P7  | 0/1 | 1/0 | 1 | 1 | – |
|     | 1   | 0   | 1 | 1 | – |
|     | 1   | 0   | 1 | 1 | – |
|     | 1   | 0   | 1 | 1 | – |
| P8  | 1   | 0   | 1 | 1 | – |
|     | 1   | 0   | 1 | 1 | – |
|     | 1   | 0   | 1 | 1 | – |
|     | 1   | 0   | 1 | 1 | – |
| P9  | 1   | 0   | 1 | 1 | – |
| P10 | 1   | 0   | 1 | 1 | – |
| P11 | 1   | 0   | 1 | 1 | – |
| P12 | 1   | 0   | 1 | 1 | – |
| P13 | 1   | 0   | 1 | 1 | – |
| P14 | 1   | 0   | 1 | 1 | – |
| P15 | 1   | 0   | 1 | 1 | – |

Inverse Dump

FIG. 4C

|     | S   | U   | M | L | C |
|-----|-----|-----|---|---|---|
| E   | 0   | 1   | 1 | 1 | – |
| P1  | 0   | 1   | 1 | 1 | – |
| P2  | 0   | 1   | 1 | 1 | – |
| P3  | 0   | 1   | 1 | 1 | – |
| P4  | 0   | 1   | 1 | 1 | – |
| P5  | 0   | 1   | 1 | 1 | – |
| P6  | 0   | 1   | 1 | 1 | – |
| P7  | 0/1 | 1/1 | 1 | 1 | – |
|     | 0   | 0   | 1 | 1 | – |
|     | 0   | 0   | 1 | 1 | – |
|     | 0   | 0   | 1 | 1 | – |
| P8  | 0   | 0   | 1 | 1 | – |
|     | 0   | 0   | 1 | 1 | – |
|     | 0   | 0   | 1 | 1 | – |
|     | 0   | 0   | 1 | 1 | – |
| P9  | 0   | 0   | 1 | 1 | – |
| P10 | 0   | 0   | 1 | 1 | – |
| P11 | 0   | 0   | 1 | 1 | – |
| P12 | 0   | 0   | 1 | 1 | – |
| P13 | 0   | 0   | 1 | 1 | – |
| P14 | 0   | 0   | 1 | 1 | – |
| P15 | 0   | 0   | 1 | 1 | – |

Normal Dump

FIG. 4D

| | S | U | M | L | C |
|---|---|---|---|---|---|
| E | 0 | 1 | 1 | 1 | - |
| P1 | 0 | 1 | 1 | 1 | - |
| P2 | 0 | 1 | 1 | 1 | - |
| P3 | 0 | 1 | 1 | 1 | - |
| P4 | 0 | 1 | 1 | 1 | - |
| P5 | 0 | 1 | 1 | 1 | - |
| P6 | 0 | 1 | 1 | 1 | - |
| P7 | 0 | 1 | 1 | 1 | - |
| P7 | 1 | 0 | 1 | 1 | - |
| P7 | 1 | 0 | 1 | 1 | - |
| P7 | 1 | 0 | 1 | 1 | - |
| P8 | 1 | 0 | 1 | 1 | - |
| P8 | 1 | 0 | 1 | 1 | - |
| P8 | 1 | 0 | 1 | 1 | - |
| P8 | 1 | 0 | 1 | 1 | - |
| P9 | 1 | 0 | 1 | 1 | - |
| P10 | 1 | 0 | 1 | 1 | - |
| P11 | 1 | 0 | 1 | 1 | - |
| P12 | 1 | 0 | 1 | 1 | - |
| P13 | 1 | 0 | 1 | 1 | - |
| P14 | 1 | 0 | 1 | 1 | - |
| P15 | 1 | 0 | 1 | 1 | - |

Inverse Dump

MEMORY SENSING SYSTEM COMPRISING NONVOLATILE MEMORY DEVICE AND RELATED METHOD OF OPERATION

CROSS-REFERENCE TO RELATED APPLICATIONS

This application is a Continuation of application Ser. No. 13/073,029, filed Mar. 28, 2011, which claims priority under 35 U.S.C. §119 to Korean Patent Application No. 10-2010-0044124 filed on May 11, 2010, the disclosure of which is hereby incorporated by reference in its entirety.

BACKGROUND OF THE INVENTION

Embodiments of the inventive concept relate generally to nonvolatile memory devices. More particularly, embodiments of the inventive concept relate to nonvolatile memory devices designed to reduce common source line (CSL) noise and improve read performance.

Nonvolatile memory devices retain stored data even when disconnected from power. Examples of nonvolatile memory devices include flash memory, read only memory, and various forms of resistive memory.

In an effort to improve the storage capacity of flash memory devices, researchers have designed some flash memory devices to store multiple bits of data per memory cell. These devices are referred to as multi-level cell flash memory devices.

To ensure reliable performance, multi-level cell flash memory devices must be capable of accurately distinguishing between different states of memory cells. One challenge in doing so is eliminating noise that can cause different states to be confused with each other.

SUMMARY OF THE INVENTION

In one embodiment of the inventive concept, a method is provided for operating a memory system including a nonvolatile memory device having a plurality of multi-level cells and a memory controller controlling a read operation on the nonvolatile memory device. The method comprises performing a first sensing operation to sense whether each of the multi-level cells assumes an on-cell state or an off-cell state in response to a first read voltage applied to a selected word line, supplying a pre-charge voltage to bit lines corresponding to multi-level cells that have been sensed as assuming the off-cell state in response to the first read voltage, and performing a second sensing operation with the supplied pre-charge voltage to sense whether each of the multi-level cells that have been sensed as assuming the off-cell state assumes an on-cell state or an off-cell state in response to a second read voltage applied to the selected word line.

In another embodiment of the inventive concept, a method is provided for operating a memory system including a nonvolatile memory device having a plurality of multi-level cells and a memory controller controlling a read operation on the nonvolatile memory device. The method comprises first sensing, by sensing latches, first hard decision bits from the multi-level cells and storing the sensed first hard decision bits in hard decision data latches, second sensing, by the sensing latches, whether the multi-level cells assume an on-cell state or an off-cell state in response to an applied read voltage, and storing resulting sensed bits as first soft decision data bits in first soft decision data latches, and first transmitting the first hard decision bits to cache latches. The second sensing and the first transmitting are performed concurrently.

In yet another embodiment of the inventive concept, a memory system comprises a nonvolatile memory device comprising a plurality of multi-level cells, a page buffer configured to sense, in a first sensing operation, whether each of the multi-level cells assumes an on-cell state or an off-cell state in response to a first read voltage applied to a selected word line, and further configured to sense, in a second sensing operation, whether each of the multi-level cells that have been sensed as assuming the off-cell state assumes an on-cell state or an off-cell state in response to a second read voltage applied to the selected word line, and a plurality of pre-charge circuits to selectively supply, in the second sensing operation, a pre-charge voltage to bit lines corresponding to multi-level cells that have been sensed as assuming the off-cell state in the first sensing operation.

These and other embodiments of the inventive concept can potentially improve the performance and/or reliability of memory access operations in a nonvolatile memory device through a combination of sequential and/or concurrent sensing, precharging, and/or transmission operations.

BRIEF DESCRIPTION OF THE DRAWINGS

The drawings illustrate selected embodiments of the inventive concept. In the drawings, like reference numbers indicate like features.

DETAILED DESCRIPTION

Embodiments of the inventive concept are described below with reference to the corresponding drawings. These embodiments are presented as teaching examples and should not be construed to limit the scope of the inventive concept.

Figure 1:
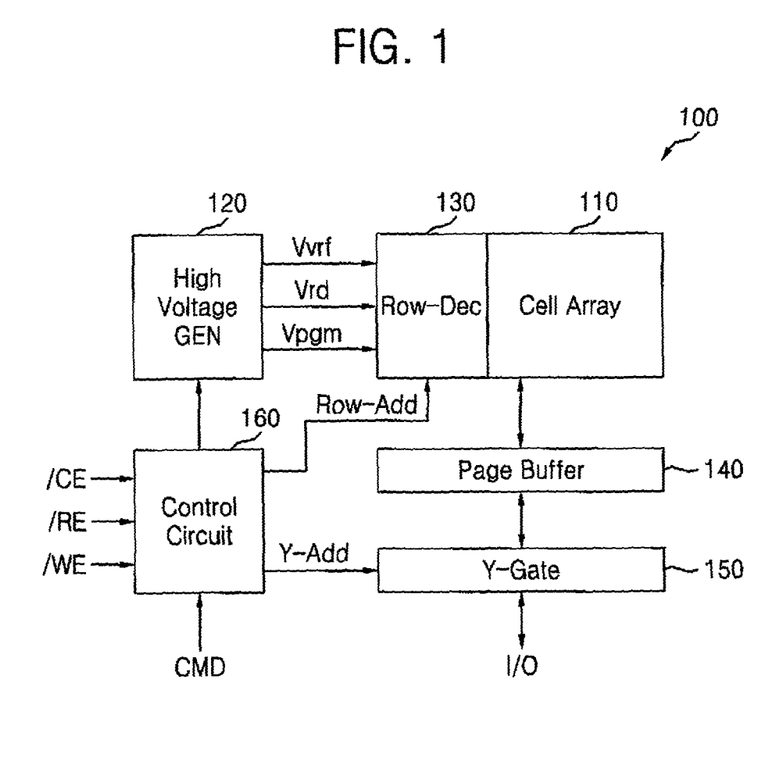
FIG. 1 is a block diagram of a nonvolatile memory device according to an embodiment of the inventive concept.

FIG. 1 is a block diagram of a nonvolatile memory device according to an embodiment of the inventive concept.

Referring to FIG. 1, a nonvolatile memory device 100 comprises a memory cell array 110, a high voltage generator 120, a row decoder 130, a page buffer 140, a Y-gate 150, and a control circuit 160.

Memory cell array 110 comprises a plurality of multi-level cells each configured to store multiple bits of data. The multi-level cells are connected to corresponding wordlines and bitlines.

High voltage generator 120 generates wordline voltages Vvrf, Vrd, and Vpgm to be supplied to memory cell array 110. High voltage generator 120 generates different wordline voltages according to different operational modes, such as a read operation mode or a program operation mode, and supplies the generated wordline voltages to selected wordlines.

During a program operation, high voltage generator 120 generates a program voltage Vpgm and supplies it to a selected wordline. During a read operation, high voltage generator 120 generates a read voltage Vrd for reading selected data and supplies it to a selected wordline. During a verify operation, high voltage generator 120 generates a verify voltage Vvrf for verifying selected data and supplies it to a selected wordline.

Row decoder 130 selects a wordline according to a row address Row-Add. Row decoder 130 supplies a wordline voltage generated from the high voltage generator 120 to a selected wordline.

Page buffer 140 operates as a sense amplifier or a write driver according to an operational mode. For example, during a program operation, page buffer 140 operates as a write driver for driving bitlines according to bits to be stored in memory cell array 110. During a read operation, page buffer 140 operates as a sense amplifier for reading programmed bits from memory cell array 110. Page buffer 140 senses multiple bits stored in a plurality of multi-level cells.

During the read operation, page buffer 140 can potentially sense erroneous bits. Accordingly, nonvolatile memory device 100 maintains soft decision data indicating a read reliability of data stored in the multi-level cells. The soft decision data typically comprises one or more bits for each memory cell. The data stored in the plurality of multi-level cells is referred to as hard decision data. Where the soft decision data comprises two soft decision data bits, for example, the soft decision data can indicate four levels of read reliability according to bits '11', '01', '00', '10'.

Figure 2:
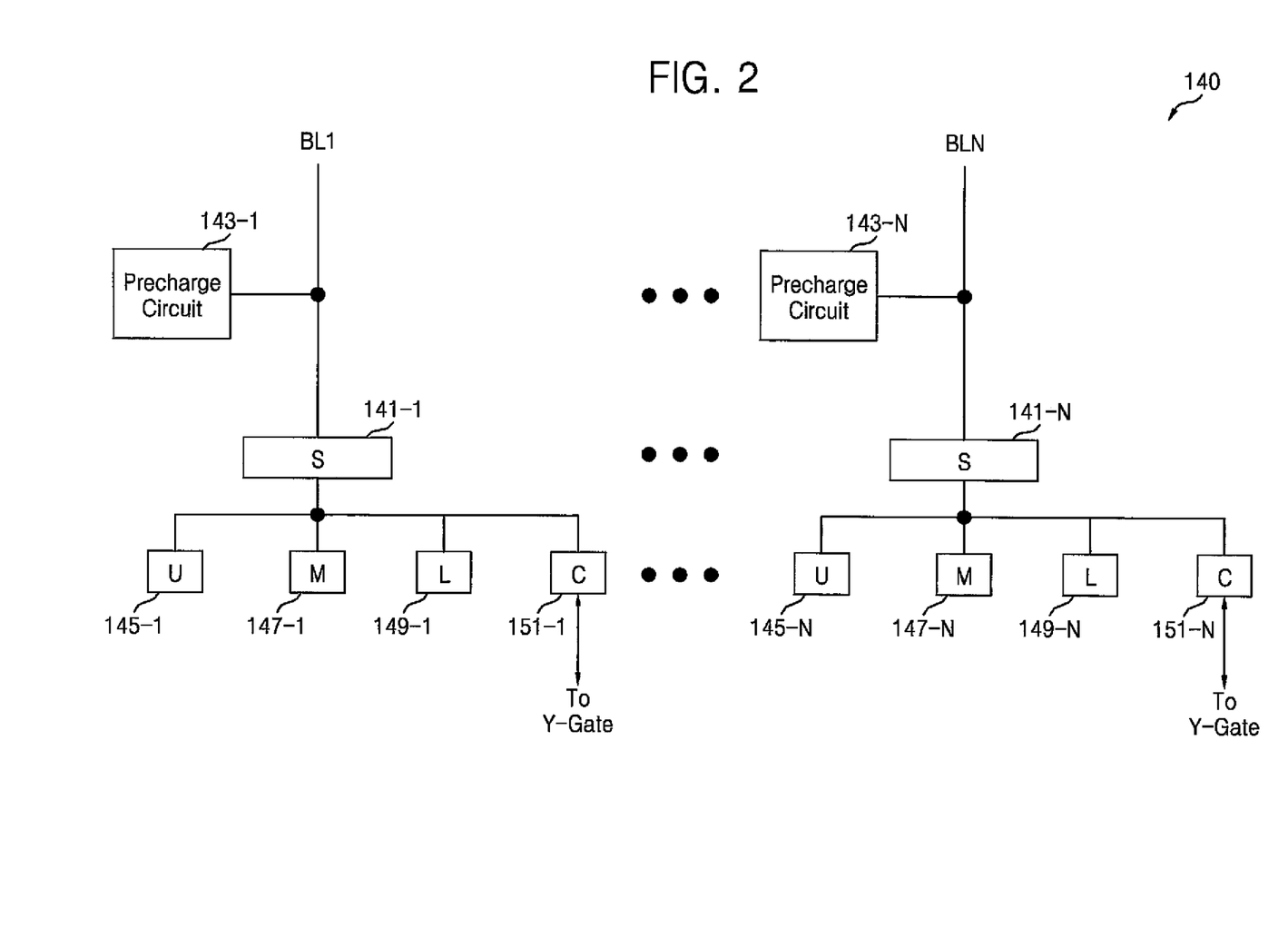
FIG. 2 is a block diagram illustrating an example of a page buffer shown in FIG. 1.
Figure 3:
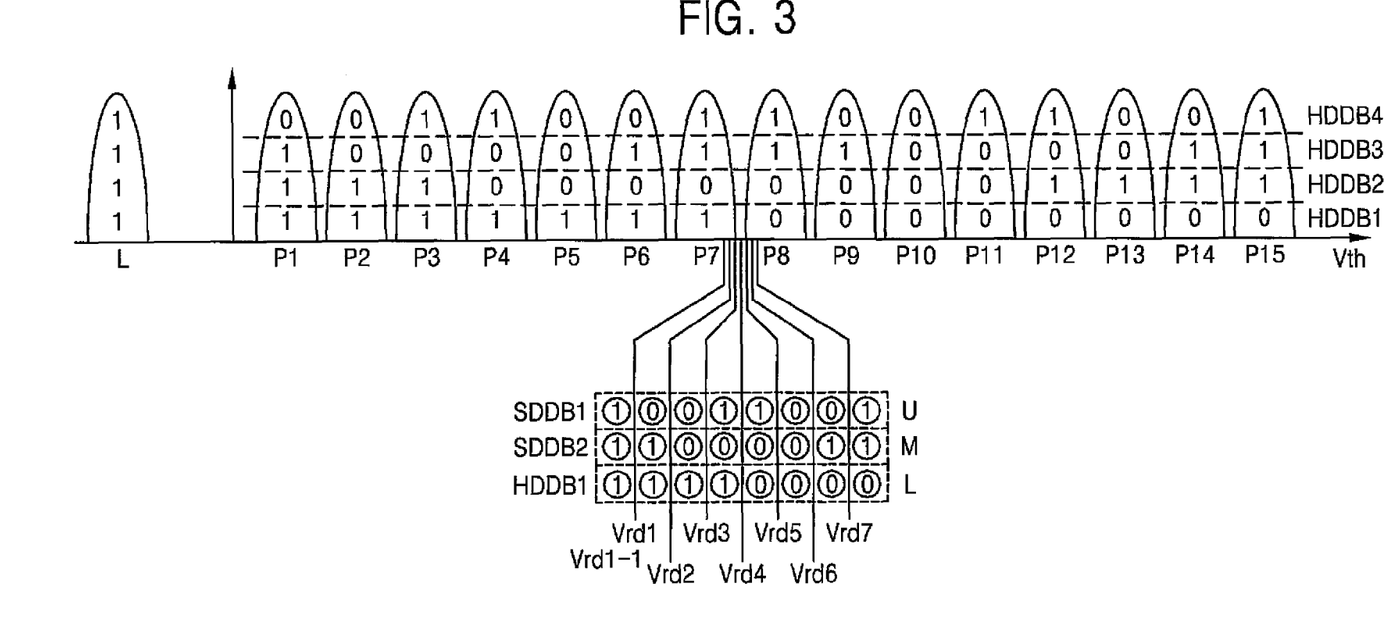
FIG. 3 is a threshold voltage diagram illustrating threshold voltage distributions corresponding to different states of multi-level cells in FIG. 1.

FIG. 2 is a block diagram illustrating an example of page buffer 140 of FIG. 1. FIG. 3 is a threshold voltage diagram illustrating threshold voltage distributions corresponding to different states of multi-level cells in FIG. 1.

Referring to FIGS. 1 through 3, page buffer 140 performs a first read operation and a second read operation. The first read operation senses whether each of the multi-level cells is in an on-cell state or an off-cell state using a first read voltage Vrd1, and sets a first soft decision data bit SDDB1 for each memory cell according to a result of the sensing. The second read operation senses a hard decision data bit HDDB1 from each of the multi-level cells using a fourth read voltage Vrd4.

Page buffer 140 comprises a plurality of sensing latches 141-1 through 141-N, a plurality of pre-charge circuits 143-1 through 143-N, a plurality of first soft decision data latches 145-1 through 145-N, a plurality of second soft decision data latches 147-1 through 147-N, a plurality of hard decision data latches 149-1 through 149-N, and a plurality of cache latches 151-1 through 151-N.

The number of soft data latches for storing the soft decision data bits can be changed according to the number of soft decision data bits. For example, where the soft decision data comprises three soft decision data bits, page buffer 140 can comprise three soft decision data latches for each bitline.

Sensing latches 141-1 through 141-N are connected to corresponding bitlines BL1 through BLN. Sensing latches 141-1 through 141-N sense whether a corresponding one of the multi-level cells is an on-cell or an off-cell by using one of first through seventh read voltages Vrd1 through Vrd7. First through seventh read voltages Vrd1 through Vrd7 are sequentially generated by high voltage generator 120 and supplied to a selected wordline. After fourth read voltage Vrd4 is supplied to the selected wordline, a hard decision data bit is obtained. After seventh read voltage Vrd7 is supplied to the selected wordline, soft decision data is obtained fully.

An on-cell is a multi-level cell that is turned on in response to a read voltage supplied to a selected wordline. A multi-level cell generally becomes an on-cell where a read voltage is higher than a threshold voltage of the multi-level cell. An off-cell is a multi-level cell that is turned off in response to a read voltage supplied to a selected wordline. The multi-level cell becomes an off-cell where the read voltage is lower than a threshold voltage of the multi-level cell. In some embodiments, sensing latches 141-1 through 141-N sense memory cells having a threshold voltage lower than first read voltage Vrd1 and latch a '1' to indicate an on-cell, and they sense memory cells having a threshold voltage higher than first read voltage Vrd1 and latch a '0' to indicate an off-cell.

First soft decision data latches 145-1 through 145-N store first soft decision data bits SDDB1 according to the sensing performed by sensing latches 141-1 through 141-N. For example, where one of the multi-level cells is an on-cell, '1' is stored in a corresponding one of first soft decision data latches 145-1 through 145-N. Where one of the multi-level cells is an off-cell, '0' is stored in a corresponding one of first soft decision data latches 145-1 through 145-N.

Pre-charge circuits 143-1 through 143-N each supply a pre-charge voltage to a corresponding bitline to allow sensing latches 141-1 through 141-N to perform sensing using first read voltage Vrd1. Noise can occur on a common source line while pre-charge circuits 143-1 through 143-N supply the pre-charge voltage to bitlines BL1 through BLN. Due to the common source line noise, sensing latches 141-1 through 141-N may inaccurately sense the states of corresponding multi-level cells.

As an example of inaccurate sensing, sensing latches 141-1 through 141-N can erroneously sense a multi-level cell as an on-cell rather than an off-cell due to common source line noise. Accordingly, sensing latches 141-1 through 141-N may require an additional sensing operation to detect a state of an erroneously sensed cell.

Pre-charge circuits 143-1 through 143-N selectively supply the pre-charge voltage to bitlines BL1 through BLN according to each sensing result in order to decrease common source line noise. In other words, pre-charge circuits 143-1 through 143-N selectively supply the pre-charge voltage to bitlines BL1 through BLN corresponding to multi-level cells that have been sensed as off-cells.

Using the pre-charge voltage and a read voltage Vrd1-1, sensing latches 141-1 through 141-N sense whether the multi-level cells that have been sensed as off-cells are in an on-cell state or an off-cell state. Accordingly, sensing latches 141-1 through 141-N sense multi-level cells that had wrongly been sensed as off-cells. The result of this subsequent sensing can be stored as first soft decision data bits SDDB1. In some embodiments, first read voltage Vrd1 and read voltage Vrd1-1 have the same magnitude.

To perform sensing using read voltage Vrd1-1, pre-charge circuits 143-1 through 143-N selectively supply the pre-charge voltage to bitlines BL1 through BLN corresponding to multi-level cells that have been sensed as off-cells using first read voltage Vrd1.

Common source line noise is reduced when pre-charge circuits 143-1 through 143-N selectively supply the pre-charge voltage. Accordingly, sensing latches 141-1 through 141-N sense whether multi-level cells are on-cells or off-cells with decreased common source line noise, and set first soft decision data bits SDDB1 according to a result of the sensing.

Pre-charge circuits 143-1 through 143-N selectively supply the pre-charge voltage to bitlines BL1 through BLN according to a sensing result obtained with read voltage Vrd1-1, and then they perform sensing using a second read voltage Vrd2.

Sensing latches 141-1 through 141-N sense whether multi-level cells are in an on-cell state or in an off-cell state using second read voltage Vrd2 and then they set second soft decision data bits SDDB2 according to a result of the sensing.

Second soft decision data latches 147-1 through 147-N store second soft decision data bits SDDB2.

Pre-charge circuits 143-1 through 143-N selectively supply the pre-charge voltage to bitlines BL1 through BLN according to a sensing result obtained with second read voltage Vrd2, and sense multi-level cells using a third read voltage Vrd3 in conjunction with the pre-charge voltage.

Sensing latches 141-1 through 141-N sense whether multi-level cells are in an on-cell state or in an off-cell state using third read voltage Vrd3 and set first soft decision data bits SDDB1 according to a result of the sensing.

First soft decision data latches 145-1 through 145-N store first soft decision data bits SDDB1.

Pre-charge circuits 143-1 through 143-N selectively supply the pre-charge voltage to bitlines BL1 through BLN according to a sensing result using third read voltage Vrd3 so as to sense by using a fourth read voltage Vrd4.

Sensing latches 141-1 through 141-N sense hard decision data bits HDDB1 using a fourth read voltage Vrd4.

Hard decision data latches 149-1 through 149-N store sensed hard decision data bits HDDB1.

Cache latches 151-1 through 151-N store first soft decision data bits SDDB1, second soft decision data bits SDDB2 or hard decision data bits HDDB1 through HDDB4.

Y gate 150 transmits data latched in page buffer 140 to an input/output buffer according to a column address Y-Add during a read operation.

Y-gate 150 transmits input data to page buffer 140 during a program operation.

Control circuit 160 controls voltage generation of high voltage generator 120 for a program operation, a verify operation, a read operation, or an erase operation in response to a control signal supplied from an external source, such as a chip enable signal /CE, a read enable signal /RE, a write enable signal /WE, or a command signal /CMD.

Control circuit 160 controls the first read operation and the second read operation of page buffer 140 to be successively performed. For example, control circuit 160 may control an order in which first read voltage Vrd1 and second read voltage Vrd2 are supplied to a selected wordline.

FIGS. 4A through 4D are data flow diagrams for explaining operations of page buffer 140 of FIG. 2.

Figure 4A:
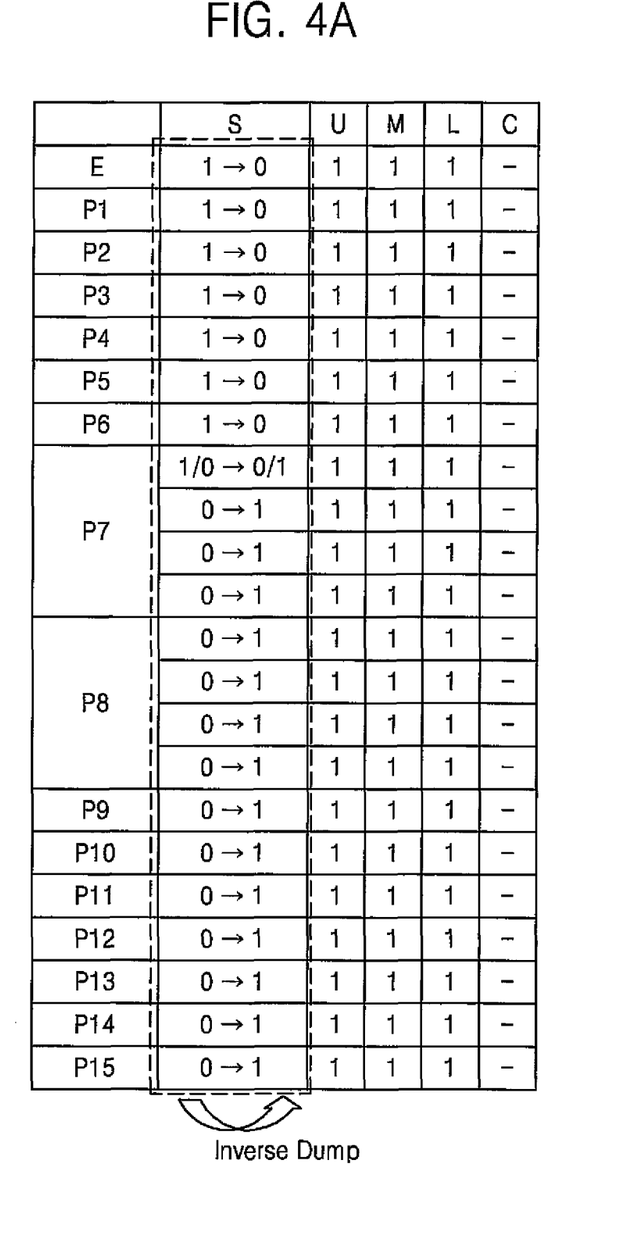
FIGS. 4A through 4D are data flow diagrams for explaining operations of the page buffer of FIG. 2.

FIG. 4A illustrates an operation in which sensing latches 141-1 through 141-N sense whether multi-level cells are on-cells or off-cells using first read voltage Vrd1.

Referring to FIG. 4A, according to each sensing result, sensing latches 141-1 through 141-N sense multi-level cells having a lower threshold voltage than first read voltage Vrd1 as on-cells and latch a '1'. For example, sensing latches 141-1 through 141-N sense cells that have a lower threshold voltage than first read voltage Vrd1, among cells in an erase state E, a first state P1 corresponding to '0111' through a seventh state P7 corresponding to '1101' as on-cells. Accordingly, as a result of the sensing, sensing latches 141-1 through 141-N latch '1'.

According to the sensing results, sensing latches 141-1 through 141-N sense multi-level cells having a higher threshold voltage than first read voltage Vrd1 as off-cells and senses '0'.

For example, sensing latches 141-1 through 141-N sense cells that have a higher threshold voltage than first read voltage Vrd1 among cells in seventh state P7 corresponding to '1101', and cells in an eighth state P8 corresponding to '1100' or a fifteenth state P15 corresponding to '1110' as off-cells. Accordingly, as a result of the sensing, sensing latches 141-1 through 141-N latch '0'.

Sensing latches 141-1 through 141-N set sensed bits according to the sensing results as first soft decision data bits SDDB1.

Sensing latches 141-1 through 141-N invert sensed bits so that pre-charge circuits 143-1 through 143-N selectively supply the pre-charge voltage. Accordingly, pre-charge circuits 143-1 through 143-N supply the pre-charge voltage to bitlines BL1 through BLN where corresponding bits of sensing latches 141-1 through 141-N are '1'. In other words, sensing latches 141-1 through 141-N invert '0' to '1' and invert '1' to '0'.

Figure 4B:
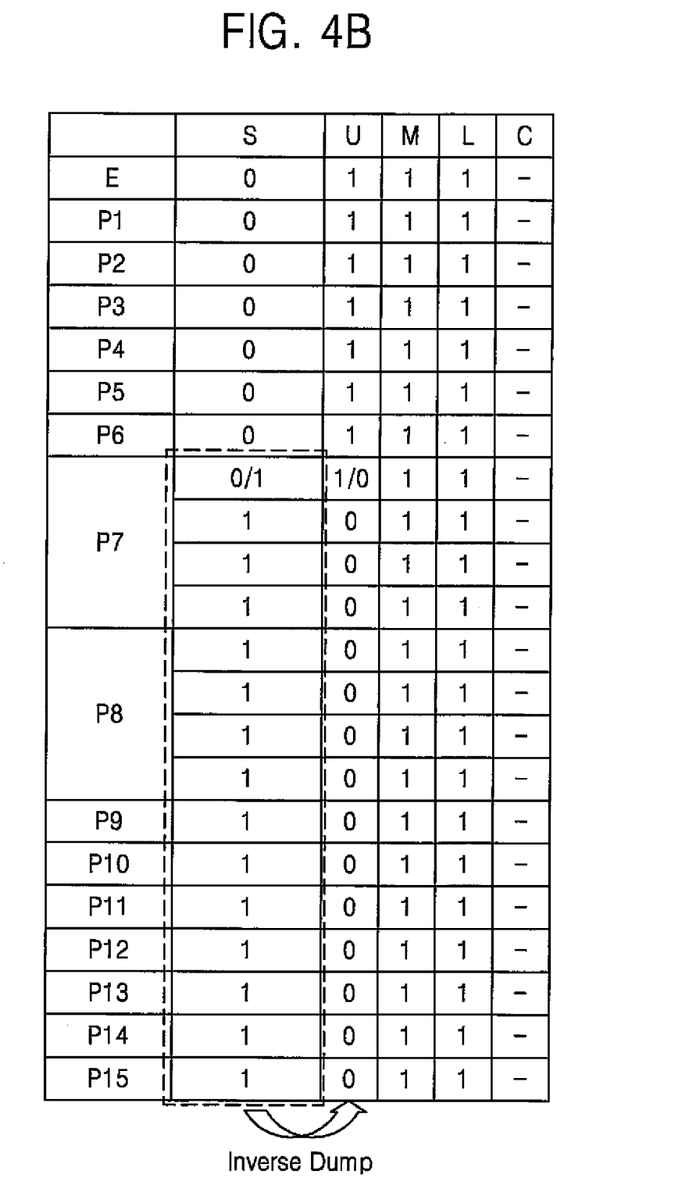

FIG. 4B illustrates an operation in which each bit is stored based on a sensing result in a plurality of first soft decision data latches.

Referring to FIG. 4B, sensing latches 141-1 through 141-N invert only a sensing bit set to '1' as a result of inversion and store inverted bits in first soft decision data latches 145-1 through 145-N.

Figure 4C:
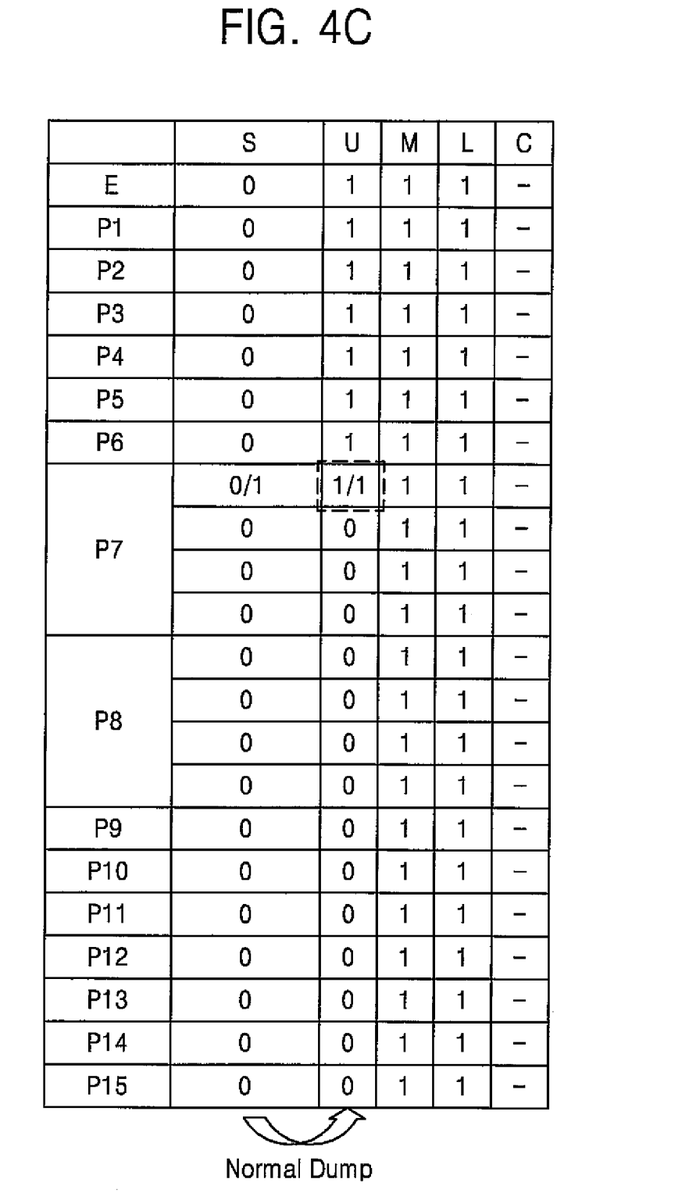

FIG. 4C illustrates an operation in which sensing latches sense whether multi-level cells are on-cells or off-cells using third read voltage Vrd3.

Referring to FIG. 4C, pre-charge circuits 143-1 through 143-N selectively supply the pre-charge voltage to bitlines BL1 through BLN.

For example, pre-charge circuits 143-1 through 143-N selectively supply the pre-charge voltage to bitlines BL1 through BLN corresponding to sensing bits set as '1' in sensing latches 141-1 through 141-N.

Sensing latches 141-1 through 141-N sense whether at least a state (e.g., seventh state P7) of multi-level cells judged as off-cells are in an on-cell state or an off-cell state by using the pre-charge voltage and read voltage Vrd1-1.

Sensing latches 141-1 through 141-N store each bit according to the sensing result in a plurality of first soft decision data latches 145-1 through 145-N.

Figure 4D:
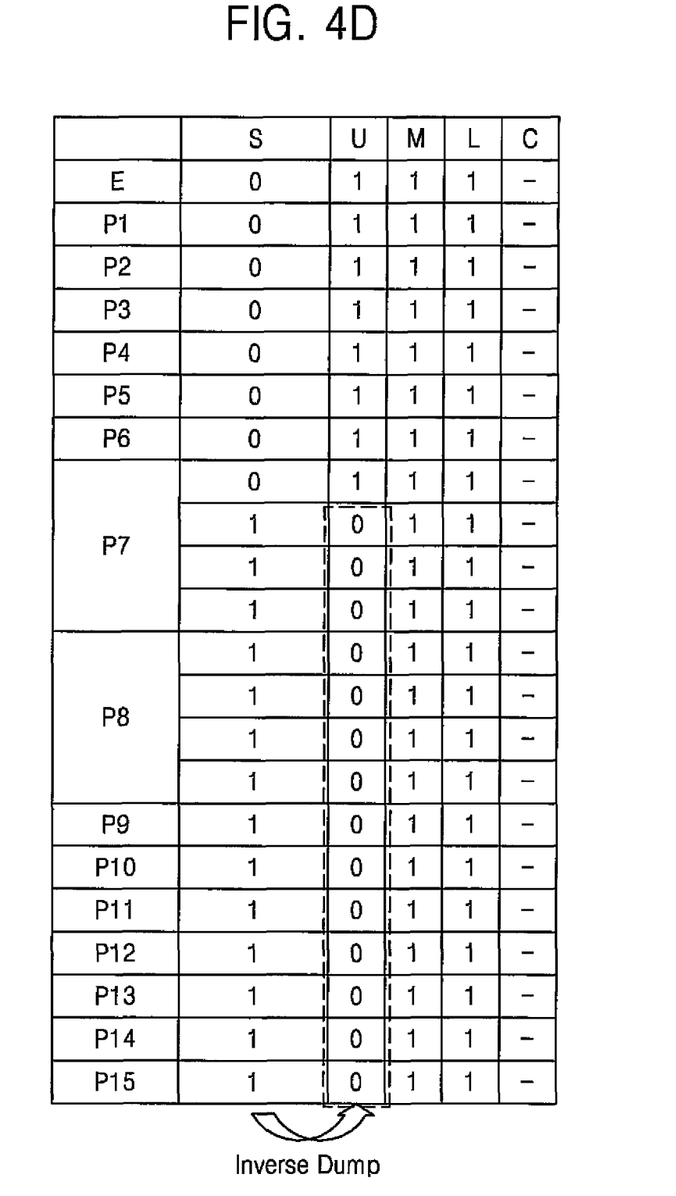

FIG. 4D illustrates a reset operation to be performed on sensing latches prior to a next sensing operation.

Referring to FIG. 4D, first soft decision data latches 145-1 through 145-N invert bits stored as '0' in first soft decision data latches 145-1 through 145-N for a next sensing operation and move inverted bits to sensing latches 141-1 through 141-N.

Figure 5:
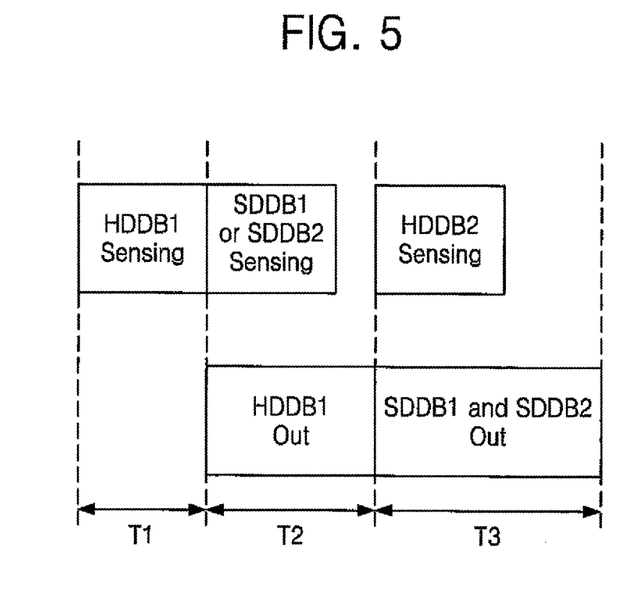
FIG. 5 is a timing diagram for explaining operations of a cache latch illustrated in FIG. 2.

FIG. 5 is a timing diagram for explaining operations of cache latches 151-1 through 151-N of FIG. 2. FIGS. 6A to 6D are data flow diagrams for explaining operations of cache latches 151-1 through 151-N of FIG. 2.

Figure 6A:
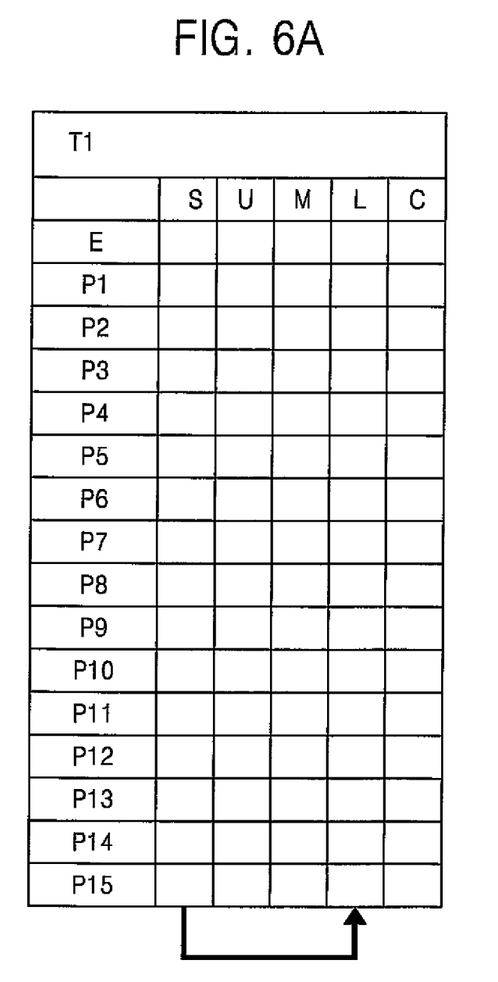
FIGS. 6A through 6D are data flow diagrams for explaining operations of the cache latch of FIG. 2.

FIG. 6A illustrates operations of page buffer 140 during a time T1. During time T1, sensing latches 141-1 through 141-N sense whether multi-level cells are on-cells or off-cells using first read voltages Vrd1 through Vrd3. Based on the sensing, sensing latches 141-1 through 141-N store bits in first soft decision data latches 145-1 through 145-N or second soft decision data latches 147-1 through 147-N until sensing a hard decision data bit.

Sensing latches 141-1 through 141-N sense hard decision data bits HDDB1 using fourth read voltage Vrd4.

Figure 6B:
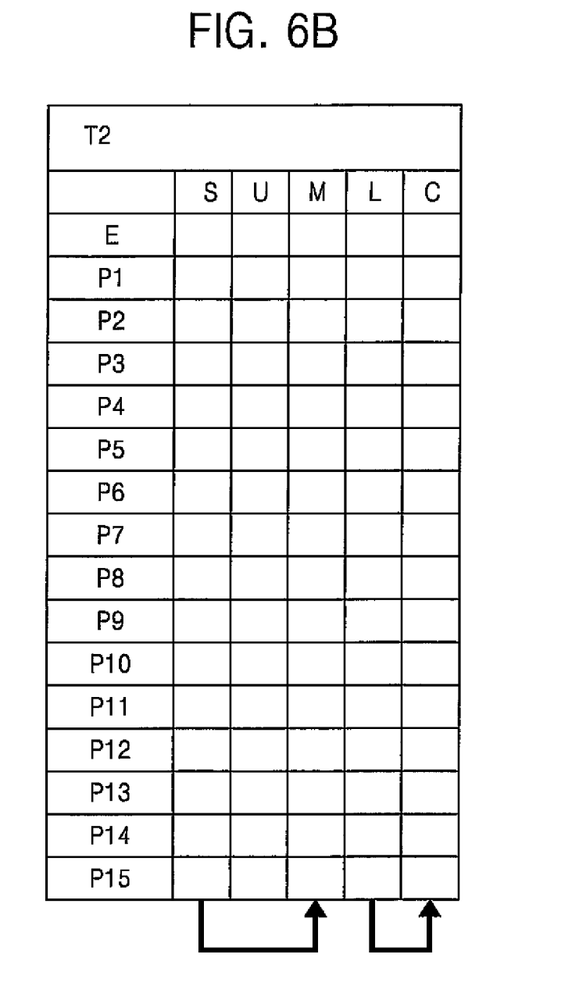
Figure 6C:
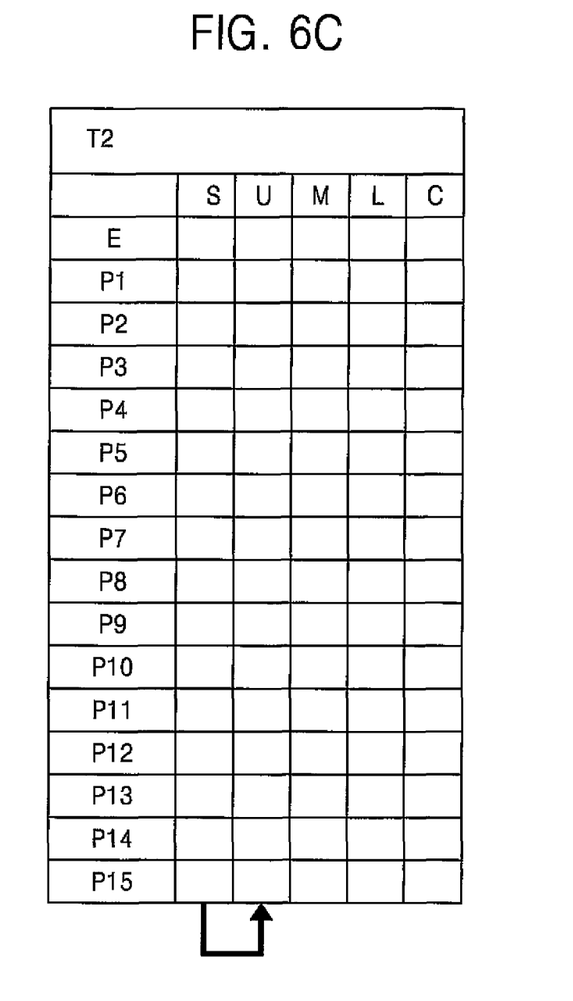

FIGS. 6B and 6C illustrate operations of page buffer 140 during a time T2. During time T2, sensing latches 141-1 through 141-N sense whether multi-level cells are on-cells or off-cells using read voltages Vrd5 through Vrd8. According to results of this sensing, sensing latches 141-1 through 141-N store bits in first soft decision data latches 145-1 through 145-N or second soft decision data latches 147-1 through 147-N.

In addition, hard decision data latches 149-1 through 149-N transmit one of a plurality of stored hard decision data bits to cache latches 151-1 through 151-N.

Figure 6D:
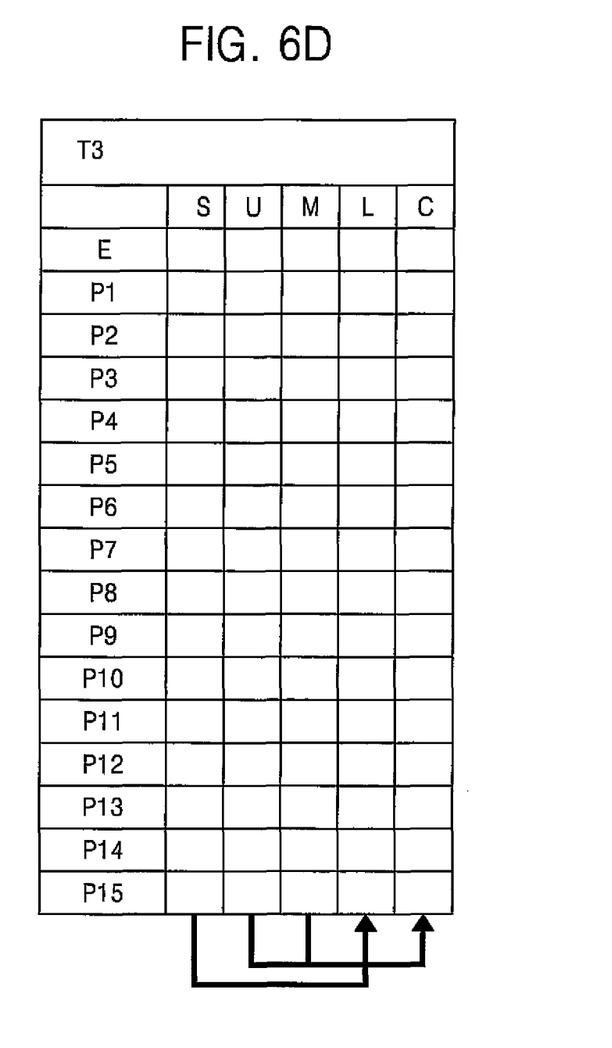

FIG. 6D illustrates operations of page buffer 140 during a time T3. During time T3, sensing latches 141-1 through 141-N sense hard decision data bits HDDB2.

Moreover, first soft decision data latches 145-1 through 145-N transmit stored first soft decision data bits SDDB1 to cache latches 151-1 through 151-N, and a plurality of second soft decision data latches 147-1 through 147-N transmit stored second soft decision data bits SDDB2 to cache latches 151-1 through 151-N.

Page buffer 140 senses and outputs hard decision data bits, senses whether multi-level cells are on-cells or off-cells, and sets bits according to a sensing result as first soft decision data bits SDDB1 or second soft decision data bits SDDB2.

Control circuit 160 can control the output operation and the setting operation to be performed at the same time, which can improve the performance of a read operation.

Figure 7:
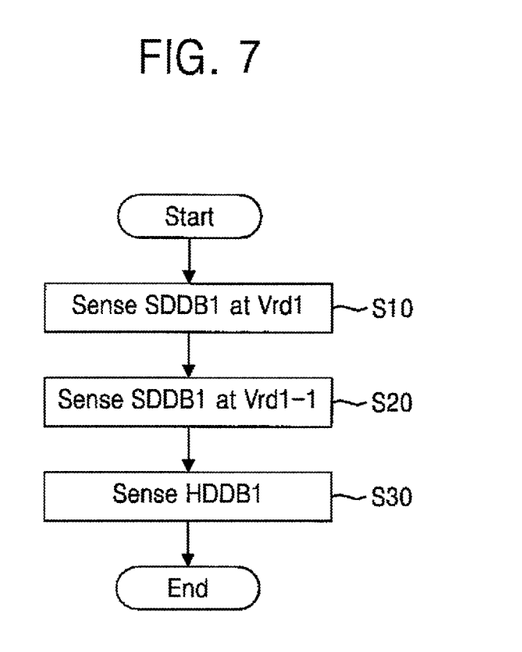
FIG. 7 is a flowchart illustrating a method of operating the nonvolatile memory device of FIG. 1.

FIG. 7 is a flowchart illustrating a method of operating nonvolatile memory device 100 according to an embodiment of the inventive concept. In the description that follows, example method steps are indicated by parentheses.

Referring to FIGS. 1 through 7, page buffer 140 senses whether multi-level cells are on-cells or off-cells using first read voltage Vrd1 during a first read operation and sets first soft decision data bits SDDB1 according to results of the sensing (S10).

Pre-charge circuits 143-1 through 143-N selectively supply the pre-charge voltage to bitlines BL1 through BLN according to the results of the sensing.

Sensing latches 141-1 through 141-N then uses the pre-charge voltage and read voltage Vrd1-1 to determine whether at least multi-level cell that was determined to be an off-cell in the first read operation is an on-cell (S20). Sensing latches 141-1 through 141-N then set first soft decision data bits SDDB1 according to the sensing.

Thereafter, sensing latches 141-1 through 141-N sense hard decision data bits HDDB1 (S30).

Figure 8:
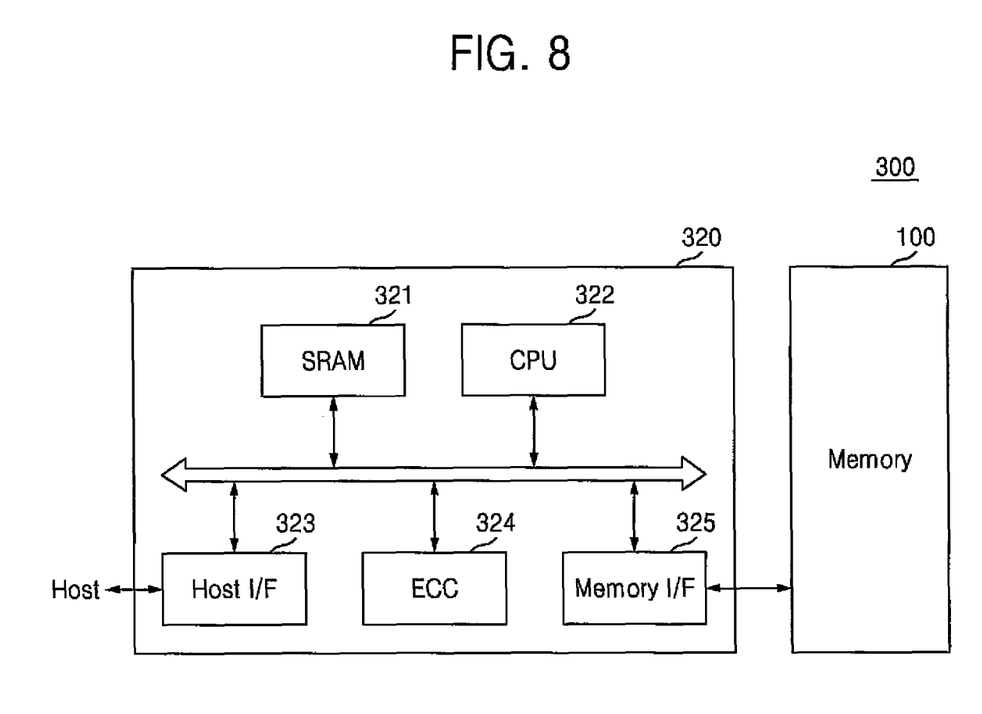
FIG. 8 is a block diagram of a memory system incorporating the nonvolatile memory device of FIG. 1.

FIG. 8 is a block diagram illustrating a memory system 300 comprising nonvolatile memory device 100 of FIG. 1 according to an embodiment of the inventive concept.

Referring to FIG. 8, memory system 300 provides mass data storage capability. Memory system 300 comprises nonvolatile memory device 100 and a memory controller 320. Memory controller 320 controls data exchange between a host and nonvolatile memory device 100.

Memory controller 320 comprises a static random access memory (SRAM) 321, a processor 322, a host interface 323, an error correction circuit 324, and a memory interface 325. SRAM 321 is used as an operational memory of processor 322. Processor 322 performs control operations for data exchange of memory controller 320. Host interface 323 implements a data exchange protocol of a host connected to the memory system 300.

Error correction circuit 324 performs error detection and error correction on hard decision data bits by using soft decision data output from nonvolatile memory device 100. Memory interface 325 interfaces with nonvolatile memory device 100.

In some embodiments, memory system 300 takes the form of a solid state disk. In a solid state disk, error correction circuit 324 can have a considerably decreased burden due to the increased accuracy of read operations performed by nonvolatile memory device 100. Additionally, memory system 300 can be combined with an application chipset, a camera image processor, and a mobile DRAM and supplied to a storage device of an information processing device that can exchange large amounts of data.

As indicated by the foregoing, a nonvolatile memory device according to certain embodiments of the inventive concept can achieve reduced common source line noise and improved read performance by sensing a soft decision data bit and a hard decision data bit in succession. In certain embodiments, read methods can be implemented by computer-readable code stored in a computer-readable recording medium.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims.

What is claimed is:

1. A method of operating a memory system including a nonvolatile memory device having a plurality of multi-level cells and a memory controller controlling a read operation on the nonvolatile memory device, the method comprising:
   performing a first sensing operation to sense whether each of the multi-level cells assumes an on-cell state or an off-cell state in response to a first read voltage applied to a selected word line;
   supplying a pre-charge voltage only to bit lines corresponding to multi-level cells that have been sensed as assuming the off-cell state in response to the first read voltage; and
   performing a second sensing operation with the supplied pre-charge voltage to sense whether each of the multi-level cells that have been sensed as assuming the off-cell state assumes an on-cell state or an off-cell state in response to a second read voltage applied to the selected word line.

2. The method of claim 1, wherein the first read voltage and the second read voltage have the same magnitude.

3. The method of claim 1, further comprising:
   setting sensed bits according to a result of the first sensing operation as first soft decision data bits including first values and second values in sensing latches; and
   first inverting the sensed bits stored in the sensing latches so that pre-charge circuits supply the pre-charge voltage to the bit lines,
   wherein the pre-charge circuits supply the pre-charge voltage to the bit lines corresponding to the sensed bits set as the first values in the sensing latches.

4. The method of claim 3, wherein the first values are one of 1 and 0 the second values are the other of the 1 and the 0.

5. The method of claim 3, further comprising:
   second inverting only sensed bits set to the first values as a result of the first inverting and storing the second inverted bits in first soft decision data latches.

6. The method of claim 5, further comprising:
   setting sensed bits according to a result of the second sensing operation as the first soft decision data bits in the sensing latches and storing the first soft decision data bits in the first soft decision data latches.

7. The method of claim 6, further comprising:
   third inverting bits stored as the second values in the first soft decision data latches and moving inverted bits according to a result of the third inverting to the sensing latches.

8. The method of claim 6, further comprising:
third sensing hard decision data bits from the multi-level cells in response to a third read voltage applied to the selected word line; and
performing, by an error correction circuit in the memory controller, error detection and error correction on the hard decision data bits by using the first soft decision data bits.

9. A method of operating a memory system including a nonvolatile memory device having a plurality of multi-level cells and a memory controller controlling a read operation on the nonvolatile memory device, the method comprising:
first sensing, by sensing latches, first hard decision bits from the multi-level cells and storing the sensed first hard decision bits in hard decision data latches;
supplying a pre-charge voltage only to bit lines corresponding to multi-level cells that have been sensed, based upon the sensed first hard decision bits, as assuming an off-cell state in response to the first sensing;
second sensing, by the sensing latches, whether the multi-level cells assume an on-cell state or the off-cell state in response to an applied read voltage and the supplied pre-charge voltage, and storing resulting sensed bits as first soft decision data bits in first soft decision data latches; and
first transmitting the first hard decision bits to cache latches,
wherein the second sensing and the first transmitting are performed concurrently.

10. The method of claim 9, further comprising:
third sensing, by the sensing latches, second hard decision bits from the multi-level cells and storing sensed bits in the hard decision data latches; and
second transmitting the first soft decision data bits to the cache latches,
wherein the third sensing and the second transmitting are performed concurrently.

11. The method of claim 9, further comprising:
receiving, by an error correction circuit in the memory controller, the first hard decision bits and the first soft decision data bits; and
performing, by the error correction circuit, error detection and error correction on the first hard decision bits by using the first soft decision data bits.

12. A memory system, comprising:
a nonvolatile memory device comprising a plurality of multi-level cells;
a page buffer configured to sense, in a first sensing operation, whether each of the multi-level cells assumes an on-cell state or an off-cell state in response to a first read voltage applied to a selected word line, and further configured to sense, in a second sensing operation, whether each of the multi-level cells that have been sensed as assuming the off-cell state assumes an on-cell state or an off-cell state in response to a second read voltage applied to the selected word line; and
a plurality of pre-charge circuits to selectively supply, in the second sensing operation, a pre-charge voltage only to bit lines corresponding to multi-level cells that have been sensed as assuming the off-cell state in the first sensing operation.

13. The memory system of claim 12, wherein the first read voltage and the second read voltage have the same magnitude.

14. The memory system of claim 12, wherein the page buffer comprises:
a plurality of soft decision data latches configured to store soft decision data bits produced by the first sensing operation; and
a plurality of hard decision data latches configured to store hard decision data bits produced by the second sensing operation.

15. The memory system of claim 14, further comprising an error correction circuit configured to perform error detection and error correction on the hard decision data bits by using the soft decision data bits.

16. The memory system of claim 12, wherein the page buffer transfers the hard decision data bits to a plurality of cache latches and outputs one of a plurality of sensed hard decision data bits from each of the plurality of cache latches during an output operation, senses whether each of the plurality of multi-level cells assumes an on-cell state or an off-cell state in response to a third read voltage applied to the selected word line during a third sensing operation, and sets additional soft decision data bits based on the third sensing operation; and
wherein the output operation and the third sensing operation are performed concurrently.

17. The memory system of claim 12, further comprising a control circuit configured to control the first sensing operation and the second sensing operation to be performed in succession.

18. The memory system of claim 12, wherein the pre-charge circuits selectively supplies the pre-charge voltage according to inverted values of stored bits produced by the first sensing operation.

19. The memory system of claim 12, wherein the nonvolatile memory device is a NAND flash memory device.

20. The memory system of claim 12, wherein the multi-level cells are 2-bit multi-level cells.

* * * * *